(12) United States Patent
Chen et al.

(10) Patent No.: US 11,637,136 B2
(45) Date of Patent: Apr. 25, 2023

(54) DISPLAY DEVICE

(71) Applicant: Au Optronics Corporation, Hsinchu (TW)

(72) Inventors: Shin-Shueh Chen, Hsinchu (TW); Yi-Wei Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 331 days.

(21) Appl. No.: 17/016,387

(22) Filed: Sep. 10, 2020

(65) Prior Publication Data

US 2021/0143192 A1    May 13, 2021

(30) Foreign Application Priority Data

Nov. 7, 2019 (TW) .................................. 108140351

(51) Int. Cl.
*H01L 27/146* (2006.01)
*G06V 40/13* (2022.01)

(52) U.S. Cl.
CPC .... *H01L 27/14603* (2013.01); *G06V 40/1318* (2022.01); *H01L 27/1461* (2013.01); *H01L 27/1462* (2013.01)

(58) Field of Classification Search
CPC ........... H01L 27/14603; H01L 27/1461; H01L 27/1462
See application file for complete search history.

(56) References Cited

U.S. PATENT DOCUMENTS

| | | | |
|---|---|---|---|
| 8,362,484 B2 | 1/2013 | Chen et al. | |
| 8,553,186 B2 | 10/2013 | Cho et al. | |
| 2006/0180816 A1 | 8/2006 | Li et al. | |
| 2010/0244033 A1* | 9/2010 | Chen ................ | H01L 31/03921 438/57 |
| 2010/0315580 A1 | 12/2010 | Cho et al. | |
| 2017/0220181 A1* | 8/2017 | Li ....................... | G06F 3/0445 |
| 2018/0114926 A1* | 4/2018 | Ujiie ................. | H01L 51/4273 |

FOREIGN PATENT DOCUMENTS

| | | |
|---|---|---|
| TW | I381534 | 1/2013 |
| TW | I395034 | 5/2013 |

* cited by examiner

*Primary Examiner* — Thanh Luu
(74) *Attorney, Agent, or Firm* — JCIPRNET

(57) ABSTRACT

A display device, including a pixel array substrate and a sensor element substrate, is provided. The sensor element substrate overlaps the pixel array substrate, and includes a substrate, a switch element, and a photosensitive element. The switch element is located on the substrate. The photosensitive element is electrically connected to the switch element, and includes a transparent electrode, a sensing layer, a metal electrode, and a barrier layer. The sensing layer is located on the transparent electrode. The metal electrode is located on the sensing layer, and covers a first sidewall of the sensing layer. The barrier layer covers a first sidewall of the transparent electrode. The barrier layer is located between the metal electrode and the sensing layer, or between the transparent electrode and the sensing layer.

12 Claims, 13 Drawing Sheets

DISPLAY DEVICE

CROSS-REFERENCE TO RELATED APPLICATION

This application claims the priority benefit of Taiwan application serial no. 108140351, filed on Nov. 7, 2019. The entirety of the abovementioned patent application is hereby incorporated by reference herein and made a part of this specification.

BACKGROUND

Technical Field

This disclosure relates to a display device, and in particular to a display device including a photosensitive element.

Description of Related Art

Currently, many manufacturers install a sensing device in their products, so as to increase convenience when using their products. For example, existing mobile phones are often loaded with a sensing device that has a fingerprint recognition function. In the existing fingerprint recognition technology, the light reflected by the fingerprint of a finger is detected by the sensing device. The ridges and furrows of the fingerprint have reflected light of different intensities, and the different light intensities will cause the sensing device to generate currents of different magnitudes, thereby distinguishing the shape of the fingerprint.

SUMMARY

The disclosure provides a display device that can increase the capability of a sensor element substrate in distinguishing a fingerprint.

At least one embodiment of the disclosure provides a display device. The display device includes a pixel array substrate and a sensor element substrate. The sensor element substrate overlaps the pixel array substrate, and includes a substrate, a switch element, and a photosensitive element. The switch element is located on the substrate. The photosensitive element is electrically connected to the switch element, and includes a transparent electrode, a sensing layer, a metal electrode, and a barrier layer. The sensing layer is located on the transparent electrode. The metal electrode is located on the sensing layer, and covers a first sidewall of the sensing layer. The barrier layer covers a first sidewall of the transparent electrode. The barrier layer is located between the metal electrode and the sensing layer, or between the transparent electrode and the sensing layer.

DESCRIPTION OF THE EMBODIMENTS

Figure 1:
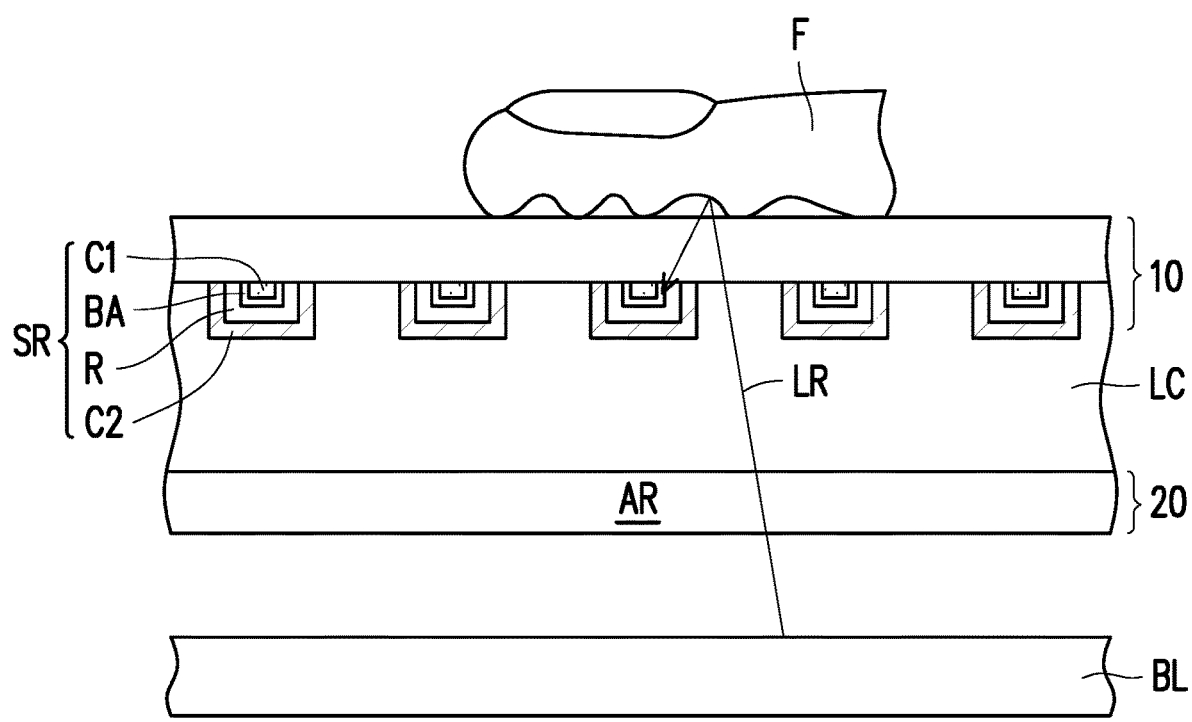
FIG. 1 is a cross-sectional schematic view of a display device according to an embodiment of the disclosure.
Figure 2:
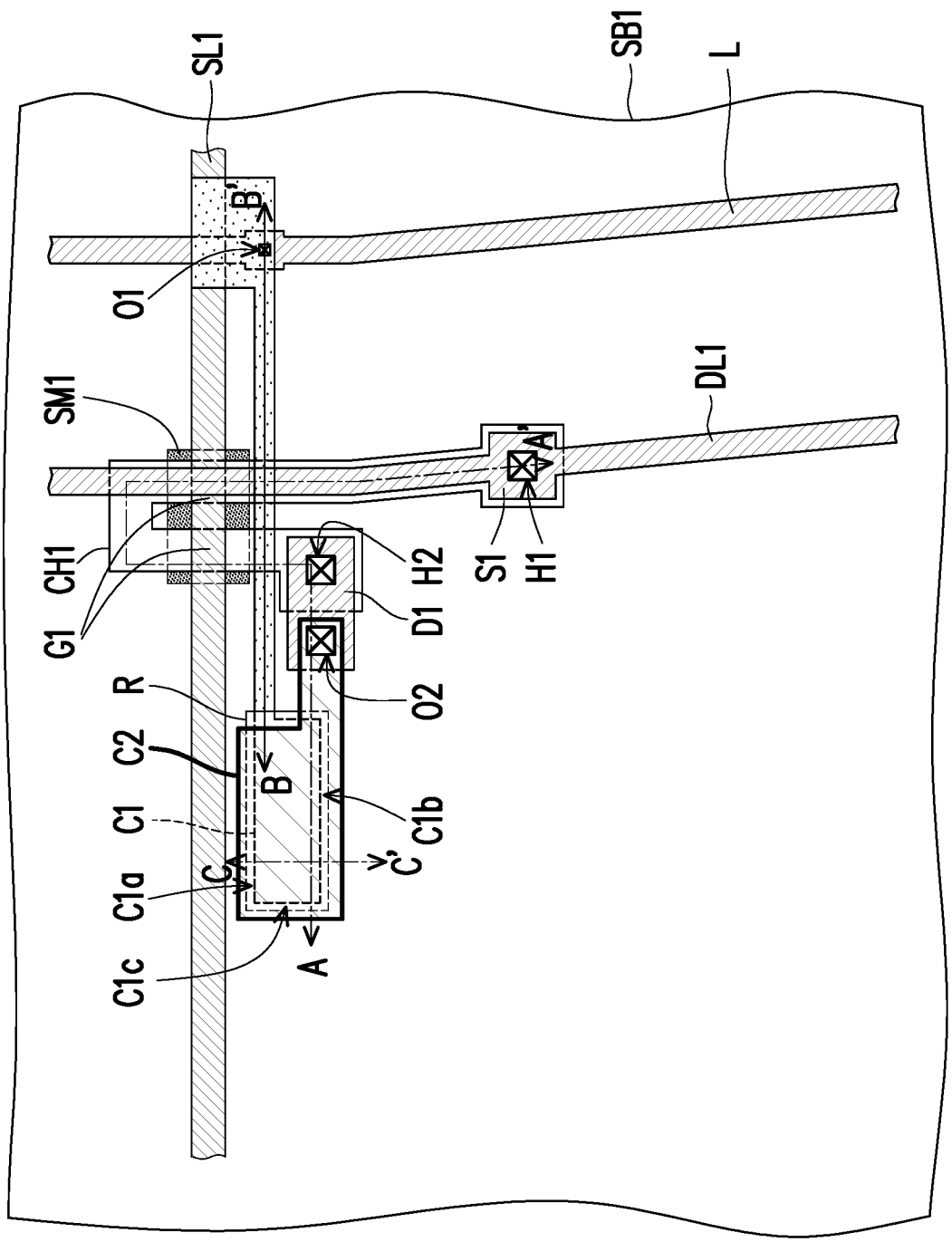
FIG. 2 is a bottom schematic view of a sensor element substrate of the display device according to an embodiment of the disclosure.
Figure 3A:
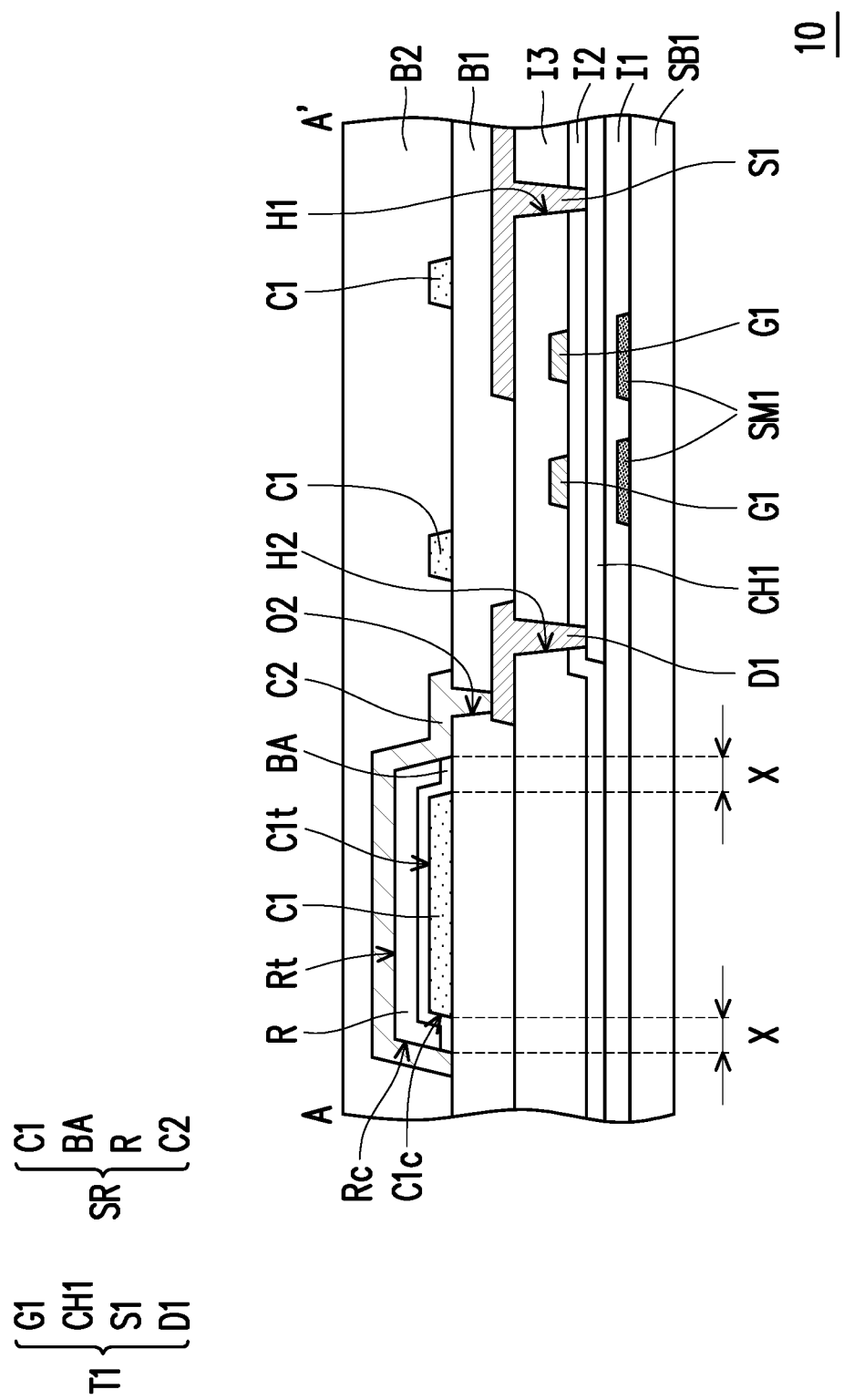
FIG. 3A is a cross-sectional schematic view of FIG. 2 taken along the cross-sectional line A-A'.
Figure 3B:
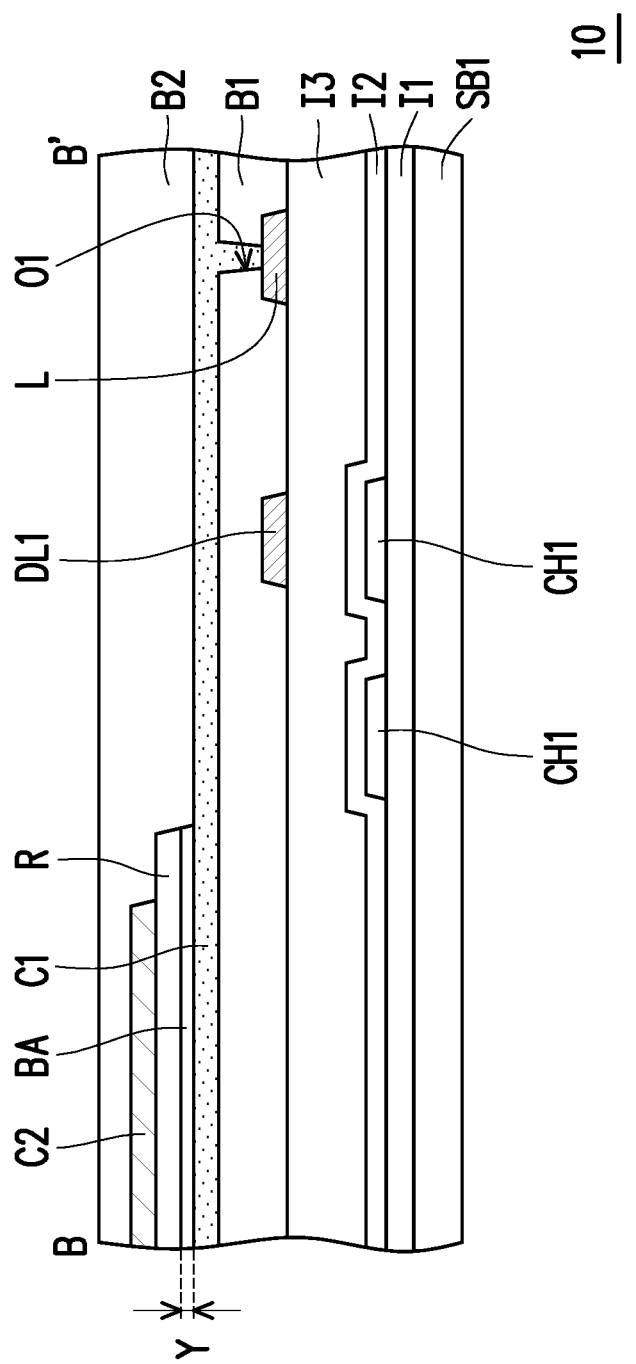
FIG. 3B is a cross-sectional schematic view of FIG. 2 taken along the cross-sectional line B-B'.
Figure 3C:
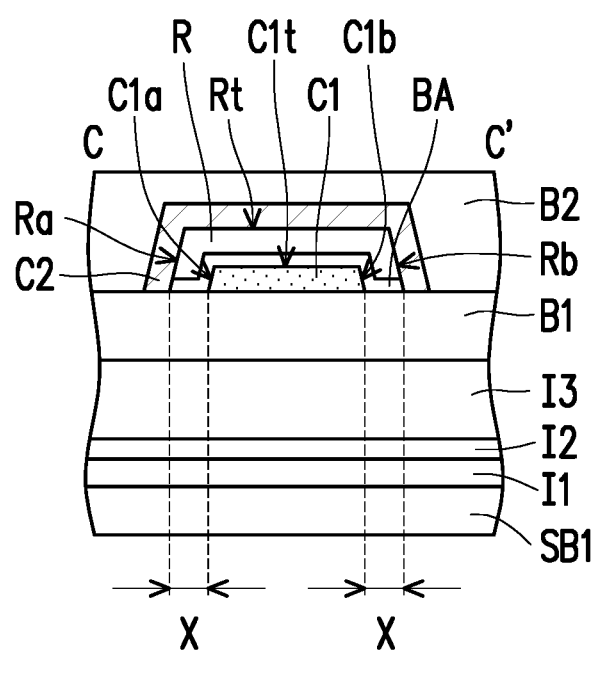
FIG. 3C is a cross-sectional schematic view of FIG. 2 taken along the cross-sectional line C-C'.

FIG. 1 is a cross-sectional schematic view of a display device according to an embodiment of the disclosure. For the ease of description, some components in a sensor element substrate 10 and a pixel array substrate 20 are omitted in FIG. 1. FIG. 2 is a bottom schematic view of a sensor element substrate of the display device according to an embodiment of the disclosure. FIG. 3A is a cross-sectional schematic view of FIG. 2 taken along the cross-sectional line A-A'. FIG. 3B is a cross-sectional schematic view of FIG. 2 taken along the cross-sectional line B-B'. FIG. 3C is a cross-sectional schematic view of FIG. 2 taken along the cross-sectional line C-C'.

A display device 1 includes the pixel array substrate 20 and the sensor element substrate 10 that overlaps the pixel array substrate 20. In the embodiment, the display device 1 further includes a display medium layer LC. The display medium layer LC is located between the pixel array substrate 20 and the sensor element substrate 10.

With reference to FIGS. 1 to 3C concurrently, the sensor element substrate 10 includes a substrate SB1, a switch element T1, and a photosensitive element SR. In the embodiment, the sensor element substrate 10 further includes a light-shielding layer SM1, an insulation layer I1, an insulation layer I2, an insulation layer I3, an insulation layer B1, a passivation layer B2, a signal line L, a first scan line SL1, and a first data line DL1.

The material of the substrate SB1 includes glass, quartz, or an organic polymer, etc.

The light-shielding layer SM1 is located on the substrate SB1. The material of the light-shielding layer SM1 includes, for example, metal, black resin, graphite or other applicable materials. The light-shielding layer SM1 may, for example, improve the issue of photo current leakage generated by the switch element T1. The insulation layer I1 covers the light-shielding layer SM1 and the substrate SB1, and the light-shielding layer SM1 is located between the insulation layer I1 and the substrate SB1.

The switch element T1, the signal line L, the first scan line SL1, and the first data line DL1 are located on the substrate SB1.

The switch element T1 is, for example, located on the insulation layer I1, and a light-shielding layer SM1 is sandwiched between the switch element T1 and the substrate SB1. The switch element T1 includes a gate G1, a source S1, a drain D1, and a semiconductor channel layer CH1. The semiconductor channel layer CH1 is located on the insulation layer I1. The gate G1 overlaps the semiconductor channel layer CH1, and the insulation layer I2 is sandwiched between the gate G1 and the semiconductor channel layer CH1. The gate G1 and the first scan line SL1 are electrically connected. In the embodiment, the gate G1 and the first scan line SL1 belong to the same conductive film layer, but the disclosure is not limited thereto. The insulation layer I3 is located on the insulation layer I2. The source S1 and the drain D1 are located above the insulation layer 13, and the source S1 and the first data line DL1 are electrically connected. In the embodiment, the source S1, the drain D1, the first data line DL1, and the signal line L belong to the same conductive film layer, but the disclosure is not limited thereto. The source S1 and the drain D1 are electrically connected to the semiconductor channel layer CH1 through openings H1 and H2. The openings H1 and H2 are, for example, located in the insulation layer I3 and the insulation layer I2. The switch element T1 is described, for example, as a top gate thin film transistor, but the disclosure is not limited thereto. According to other embodiments, the switch element T1 may also be a bottom gate thin film transistor or other suitable thin film transistors.

The insulation layer B1 covers the switch element T1. The photosensitive element SR is located on the insulation layer B1, and is electrically connected to the switch element T1. The photosensitive element SR includes a transparent electrode C1, a sensing layer R, a metal electrode C2, and a barrier layer BA.

The transparent electrode C1 is located on the insulation layer B1. The signal line L is electrically connected to the transparent electrode C1. For example, the transparent electrode C1 is electrically connected to the signal line L through an opening O1. The opening O1 is, for example, located in the insulation layer B1. The material of the transparent electrode C1 is preferably a transparent conductive material, such as indium tin oxide, indium zinc oxide, aluminum tin oxide, aluminum zinc oxide, indium gallium zinc oxide, other suitable oxides, or a stacked layer of at least two of the above materials. Although in the embodiment, the signal line L is substantially parallel to the first data line DL1, the disclosure is not limited thereto. In other embodiments, the signal line L is substantially parallel to the first scan line SL1.

The sensing layer R is located on the transparent electrode C1. The sensing layer R covers a top surface C1$t$ of the transparent electrode C1, a first sidewall C1$a$ of the transparent electrode C1, and a second sidewall C1$b$ of the transparent electrode C1. In the embodiment, the transparent electrode C1 further has a third sidewall C1$c$. The third sidewall C1$c$ is connected to the first sidewall C1$a$ and the second sidewall C1$b$, and the sensing layer R covers the third sidewall C1$c$ of the transparent electrode C1.

The material of the sensing layer R is, for example, silicon-rich oxide (SRO) or other suitable materials. In the embodiment, the shape of the sensing layer R projected vertically on the substrate SB1 is rectangular, and a long side of the sensing layer R is substantially parallel to the first scan line SL1, but the disclosure is not limited thereto.

The metal electrode C2 is located on the sensing layer R, and covers a first sidewall Ra of the sensing layer. In the embodiment, the metal electrode C2 covers a top surface Rt of the sensing layer R, the first sidewall Ra of the sensing layer R, a second sidewall Rb of the sensing layer R, and a third sidewall Rc of the sensing layer R. The second sidewall Rb is opposite to the first sidewall Ra, and the third sidewall Rc is connected to the second sidewall Rb and the first sidewall Ra. In the embodiment, the metal electrode C2 is farther away from the substrate SB1 than the transparent electrode C1. The metal electrode C2 is closer to the pixel array substrate 20 than the transparent electrode C1.

The metal electrode C2 is electrically connected to the switch element T1. For example, the metal electrode C2 is electrically connected to the switch element T1 through an opening O2. The opening O2 is, for example, located in the insulation layer B1. The material of the metal electrode C2 is, for example, molybdenum, aluminum, titanium, copper, gold, silver, other conductive materials, or a stack of two or more of the above materials. In an embodiment, the reflectivity of the metal electrode C2 is from 30% to 100%, preferably from 50% to 100%.

In some embodiments, a minimum distance X between a portion of the metal electrode C2 in contact with the upper surface of the insulation layer B1 and a portion of the transparent electrode C1 in contact with the upper surface of the insulation layer B1 is from 0.5 micrometer ($\mu$m) to 50 $\mu$m. The preferred value of X is from 2 $\mu$m to 20 $\mu$m, but the disclosure is not limited thereto. In some embodiments, increasing the distance X may increase the photoelectric current, and increase the capability of the photosensitive element SR in recognizing a fingerprint.

The barrier layer BA covers the first sidewall C1$a$ of the transparent electrode C1. In the embodiment, the barrier layer BA covers the top surface C1$t$ of the transparent electrode C1, the first sidewall C1$a$ of the transparent electrode C1, the second sidewall C1$b$ of the transparent electrode C1, and the third sidewall C1$c$ of the transparent electrode C1. Since the barrier layer BA covers the first sidewall C1$a$, the second sidewall C1$b$, and the third sidewall C1$c$ of the transparent electrode C1, it is possible to prevent the first sidewall C1$a$, the second sidewall C1$b$, and the third sidewall C1$c$ of the transparent electrode C1 from being damaged during an etching process, thereby increasing the reliability of the photosensitive element SR.

The barrier layer BA is located between the metal electrode C2 and the sensing layer R, or between the transparent electrode C1 and the sensing layer R. In the embodiment, the barrier layer BA is located between the transparent electrode C1 and the sensing layer R, thereby solving the issue of the sensing layer R cracking and the issue of degradation due to DC stress of the photosensitive element SR.

The barrier layer BA may suppress the photoelectric current, so as to flatten out the current-voltage curve (I-V curve) of the photosensitive element SR. Therefore, even if the photoelectric current is reduced due to current leakage of the photosensitive element SR, the fingerprint recognition by the photosensitive element SR will not be unclear due to an excessive change in the voltage difference.

In the embodiment, a thickness Y of the barrier layer BA is between 20 angstroms (Å) and 200 Å. If the barrier layer BA is too thick, the photosensitive element SR cannot generate enough photoelectric current. If the barrier layer BA is too thin, the current-voltage curve (I-V curve) of the photosensitive element SR becomes too steep, and the fingerprint recognition by the photosensitive element SR tends to be unclear due to an excessive change in the voltage difference.

In some embodiments, the material of the barrier layer BA includes silicon oxide, aluminum oxide, or other suitable materials. In some embodiments, the refractive index of the barrier layer BA is between 1.35 and 1.55.

In the embodiment, a sidewall of the sensing layer R and a sidewall of the barrier layer BA are aligned. For example, the sensing layer R and the barrier layer BA are patterned by the same patterning process. Therefore, the sidewall of the sensing layer R and the sidewall of the barrier layer BA are aligned, but the disclosure is not limited thereto. In other embodiments, the sensing layer R and the barrier layer BA are patterned by different patterning processes, therefore the sidewall of the sensing layer R and the sidewall of the barrier layer BA are not necessarily aligned.

In the embodiment, the sensor element substrate 10 further includes the passivation layer B2. The passivation layer B2 covers the transparent electrode C1, the metal electrode C2, and the insulation layer B1. The passivation layer B2 is, for example, located between the metal electrode C2 and the display medium layer LC (shown in FIG. 1).

Figure 4:
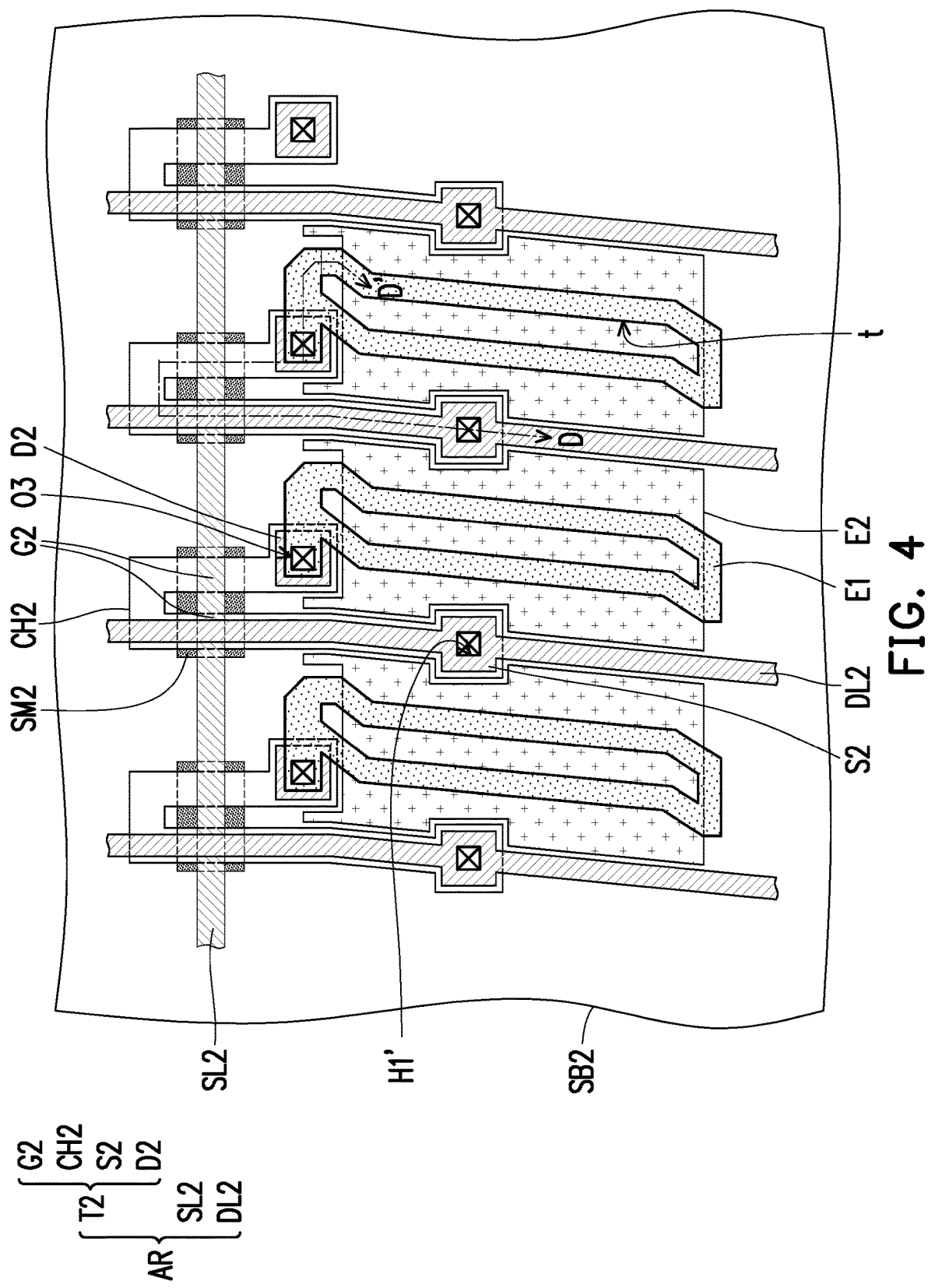
FIG. 4 is a top schematic view of a pixel array substrate of the display device according to an embodiment of the disclosure.
Figure 5:
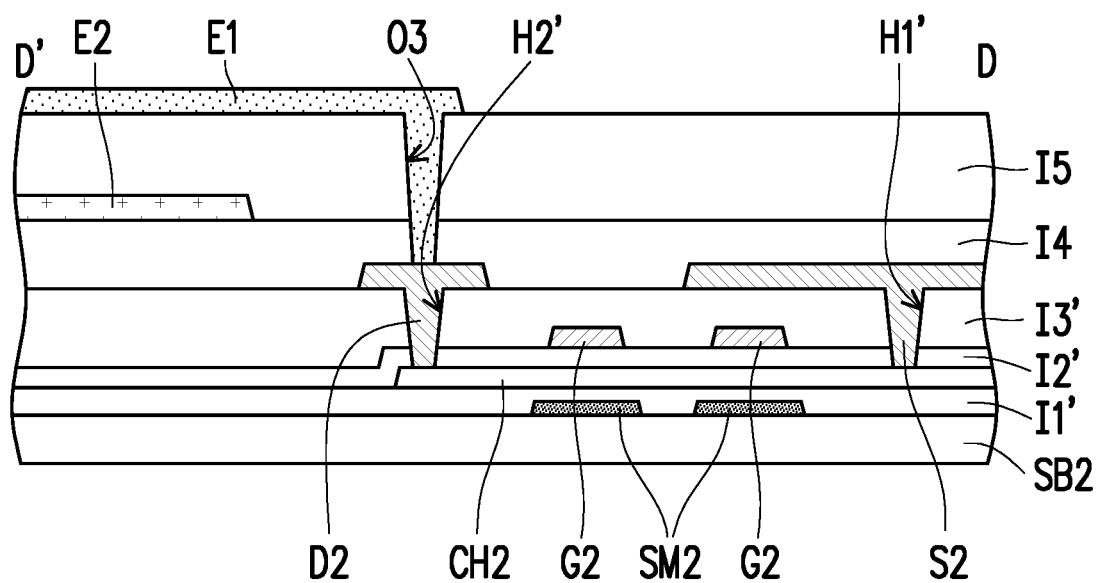
FIG. 5 is a cross-sectional schematic view of FIG. 4 taken along the cross-sectional line D-D'.
Figure 6:
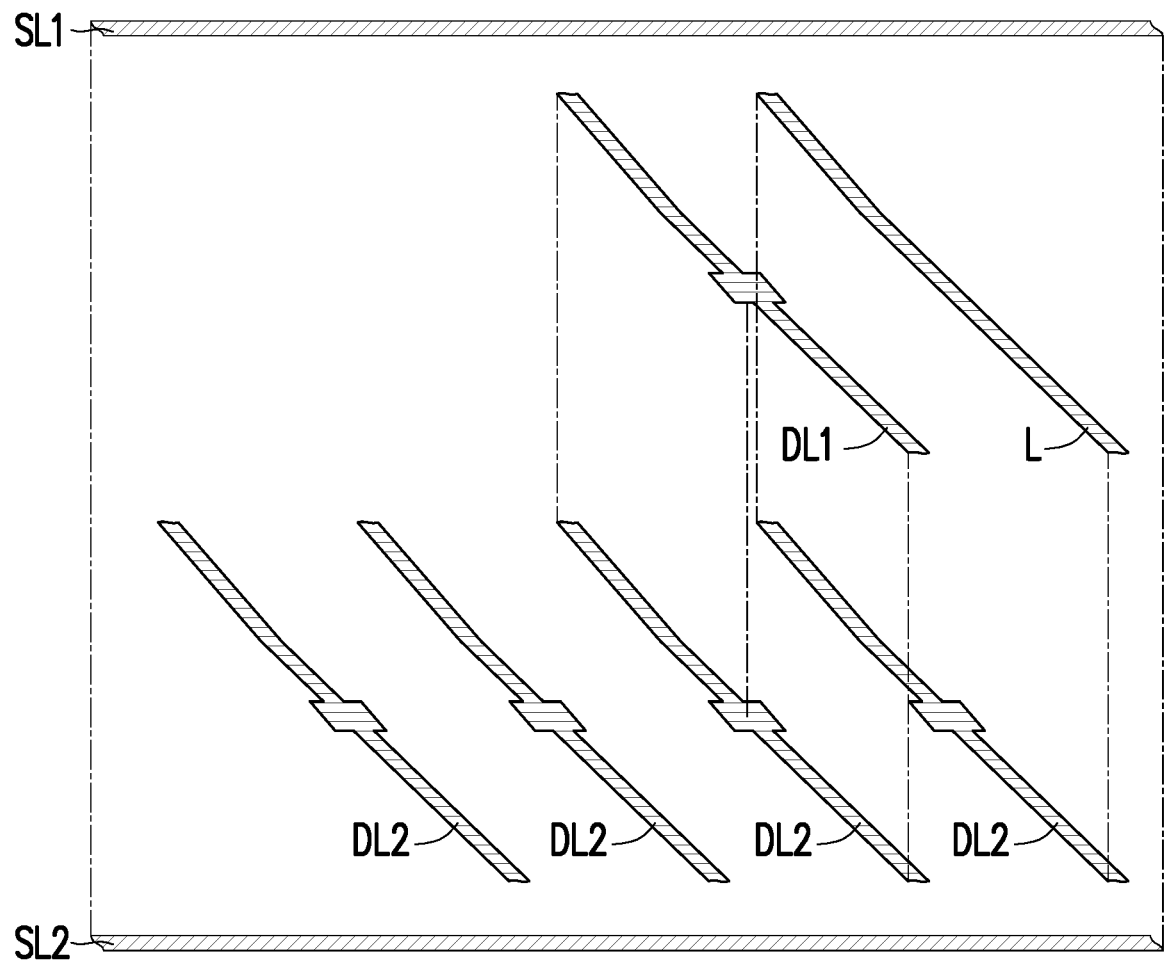
FIG. 6 is an exploded schematic view of the display device according to an embodiment of the disclosure.

FIG. 4 is a top schematic view of a pixel array substrate of the display device according to an embodiment of the disclosure. FIG. 5 is a cross-sectional schematic view of FIG. 4 taken along the cross-sectional line D-D'. FIG. 6 is an exploded schematic view of the display device according to an embodiment of the disclosure. For the ease of description, the first scan line SL1, the first data line DL1, a second scan line SL2, a second data line DL2, and the signal line L are shown in FIG. 6, while other components are omitted.

With reference to FIGS. 1, 4 and 5, the pixel array substrate 20 includes a thin film transistor array AR. In the embodiment, the pixel array substrate 20 further includes a substrate SB2, a light-shielding layer SM2, an insulation layer IF, an insulation layer I2', an insulation layer I3', an insulation layer 14, an insulation layer 15, a pixel electrode E1, and a common electrode E2.

The thin film transistor array AR includes a thin film transistor T2, the second scan line SL2, and the second data line DL2. The light-shielding layer SM2, the thin film transistor T2, the second scan line SL2, and the second data line DL2 are located on the substrate SB2.

The thin film transistor T2 is, for example, located on the insulation layer I1', and the light-shielding layer SM2 is sandwiched between the thin film transistor T2 and the substrate SB2. The thin film transistor T2 includes a gate G2, a source S2, a drain D2, and a semiconductor channel layer CH2. The semiconductor channel layer CH2 is located on the insulation layer I1'. The gate G2 overlaps the semiconductor channel layer CH2, and the insulation layer I2' is sandwiched between the gate G2 and the semiconductor channel layer CH2. The gate G2 and the second scan line SL2 are electrically connected. In the embodiment, the gate G2 and the second scan line SL2 belong to the same conductive film layer, but the disclosure is not limited thereto. The insulation layer I3' is located on the insulation layer I2'. The source S2 and the drain D2 are located above the insulation layer I3', and the source S2 and the second data line DL2 are electrically connected. In the embodiment, the source S2 and the second data line DL2 belong to the same conductive film layer, but the disclosure is not limited thereto. The source S2 and the drain D2 are electrically connected to the semiconductor channel layer CH2 through openings H1' and H2'. The opening H1' and H2' are, for example, located in the insulation layer I3' and the insulation layer I2'. The thin film transistor T2 is described, for example, as a top gate thin film transistor, but the disclosure is not limited thereto. According to other embodiments, the thin film transistor T2 may also be a bottom gate thin film transistor. In some embodiments, the process of forming the thin film transistor T2 is similar to the process of forming the switch element T1.

With reference to FIG. 2, FIG. 4, and FIG. 6, in some embodiments, the first scan line SL1 and the first data line DL1 respectively overlap the second scan line SL2 and the second data line DL2 in a direction perpendicular to the substrate SB1 (or a direction perpendicular to the substrate SB2), thereby elevating the aperture ratio of the display device 1. In some embodiments, the signal line L also overlaps the second data line DL2 in the direction perpendicular to the substrate SB1 (or the direction perpendicular to the substrate SB2), so as to further elevate the aperture ratio of the display device 1.

The insulation layer 14 is located on the thin film transistor array AR. The common electrode E2 is located on the insulation layer 14. In some embodiments, the common electrode E2 is electrically connected to a common voltage through a common signal line (not shown). The insulation layer 15 is located on the common electrode E2 and the insulation layer 14.

In the embodiment, the pixel electrode E1 is located on the insulation layer IS, and the pixel electrode E1 overlaps the common electrode E2. The pixel electrode E1 is electrically connected to the drain D2 of the thin film transistor T2 through an opening O3 in the insulation layer 14 and the insulation layer IS, but the disclosure is not limited thereto. The pixel electrode E1 includes a slit t. In some embodiments, multiple common electrodes E2 are electrically connected to each other, and a same common voltage is applied to them.

In some embodiments, an alignment layer (not shown) is further included between the pixel electrode E1 and the display medium layer LC, but the disclosure is not limited thereto.

Next, with reference to FIG. 1, the display device 1 may further include a backlight module BL. The backlight module BL is disposed beneath the pixel array substrate 20. In other words, the pixel array substrate 20 is located between the backlight module BL and the sensor element substrate 10. When a finger F approaches the sensor element substrate 10, a light LR emitted by the backlight module BL will be reflected by the finger F to the sensing layer R.

Based on the above, the barrier layer BA of the photosensitive element SR is located between the transparent electrode C1 and the sensing layer R. Therefore, the photoelectric current of the photosensitive element SR may be suppressed, so as to flatten out the current-voltage curve (I-V curve) of the photosensitive element SR. Therefore, even if the photoelectric current is reduced due to current leakage of the photosensitive element SR, the fingerprint recognition by the photosensitive element SR will not be unclear due to an excessive change in the voltage difference.

Figure 7:
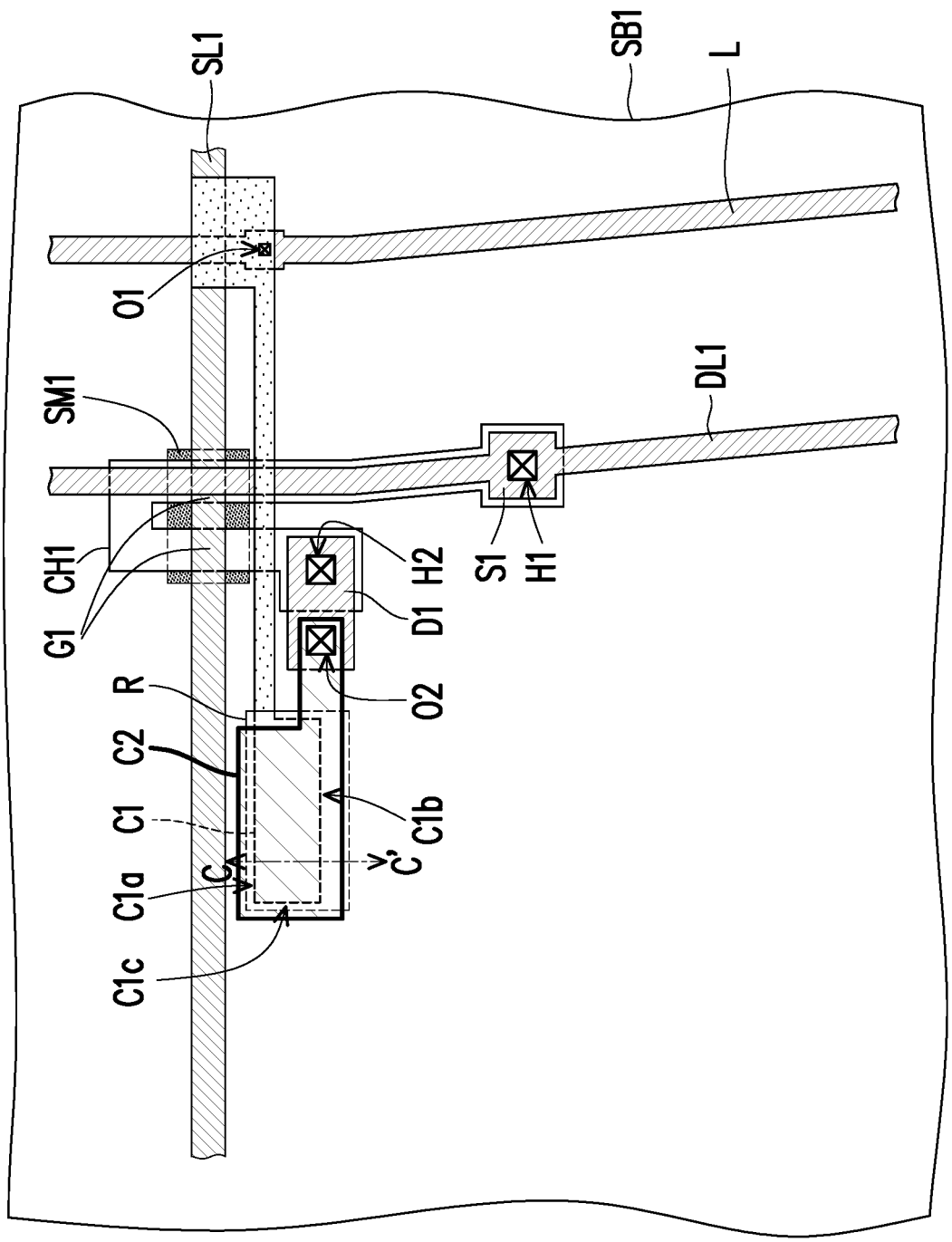
FIG. 7 is a bottom schematic view of a sensor element substrate of the display device according to an embodiment of the disclosure.
Figure 8:
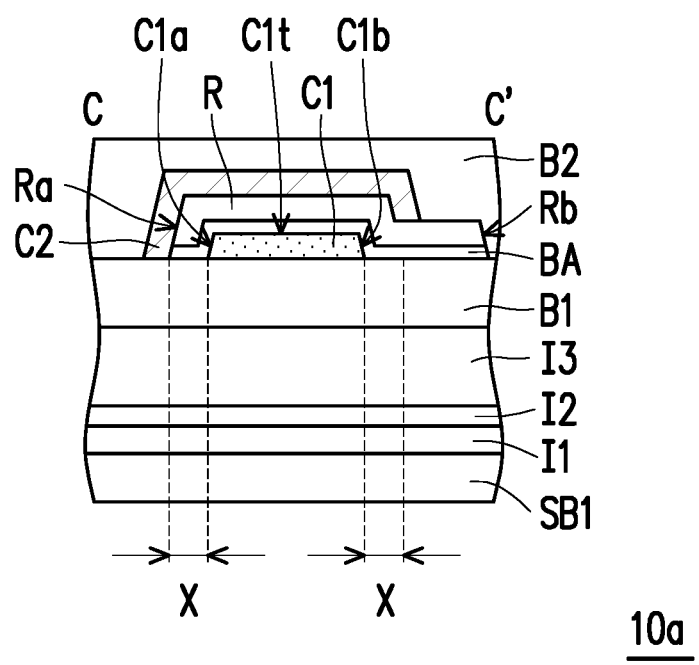
FIG. 8 is a cross-sectional schematic view of FIG. 7 taken along the cross-sectional line C-C'.

FIG. 7 is a bottom schematic view of a sensor element substrate of the display device according to an embodiment of the disclosure. FIG. 8 is a cross-sectional schematic view of FIG. 7 taken along the cross-sectional line C-C'. It must be noted that the embodiments of FIGS. 7 and 8 continue to use the element labels and part of the content of the embodiments of FIGS. 1 to 6. The same or similar labels are used to represent the same or similar elements, and description of the same technical content is omitted. Please refer to the foregoing embodiments for the description of the omitted part, which is not reiterated here.

The main difference between a sensor element substrate 10a in FIG. 7 and the sensor element substrate 10 in FIG. 2 is that in the sensor element substrate 10a, a side of a sensing layer R closest to an opening region (the side closest to a pixel electrode E1) is not covered by a metal electrode C2.

With reference to FIGS. 7 and 8, in addition to being located between the sensing layer R and a transparent electrode C1, a barrier layer BA is further located between the sensing layer R and an insulation layer B1. The side of the sensing layer R closest to the opening region (the side closest to the pixel electrode E1) and a side of the barrier layer BA closest to the opening region (the side closest to the pixel electrode E1) are not covered by the metal electrode C2. For example, the metal electrode C2 exposes a second sidewall Rb of the sensing layer R.

Based on the above, the sensing layer R may have a larger area to receive light, thereby increasing the quality of the photosensitive element SR.

Figure 9:
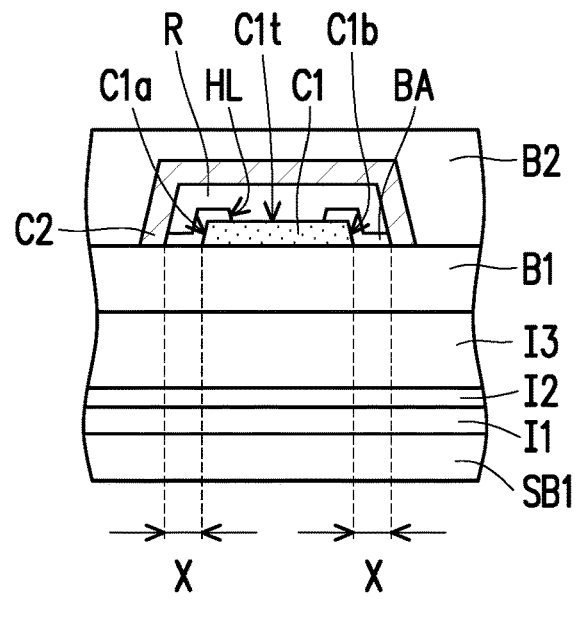
FIG. 9 is a cross-sectional schematic view of a sensor element substrate of the display device according to an embodiment of the disclosure.

FIG. 9 is a cross-sectional schematic view of a sensor element substrate of the display device according to an embodiment of the disclosure. It must be noted that the embodiment of FIG. 9 continues to use the element labels and part of the content of the embodiments of FIGS. 1 to 6. The same or similar labels are used to represent the same or similar elements, and description of the same technical content is omitted. Please refer to the foregoing embodiments for the description of the omitted part, which is not reiterated here.

The main difference between a sensor element substrate 10b in FIG. 9 and the sensor element substrate 10 in FIG. 3C is that, in the sensor element substrate 10b, a barrier layer BA has a hole HL located on a top surface C1t of a transparent electrode C1.

In the embodiment, the hole HL exposes the top surface C1t of the transparent electrode C1. Therefore, the sensing layer R may fill the hole HL and be in direct contact with the top surface C1t of the transparent electrode C1, thereby increasing the photoelectric current of the photosensitive element SR.

Figure 10:
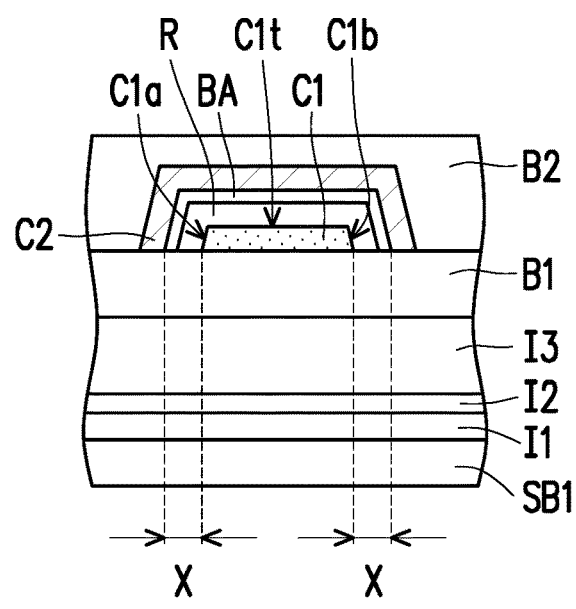
FIG. 10 is a cross-sectional schematic view of a sensor element substrate of the display device according to an embodiment of the disclosure.

FIG. 10 is a cross-sectional schematic view of a sensor element substrate of the display device according to an embodiment of the disclosure. It must be noted that the embodiment of FIG. 10 continues to use the element labels and part of the content of the embodiments of FIGS. 1 to 6. The same or similar labels are used to represent the same or similar elements, and description of the same technical content is omitted. Please refer to the foregoing embodiments for the description of the omitted part, which is not reiterated here.

The main difference between a sensor element substrate 10c in FIG. 10 and the sensor element substrate 10 in FIG. 3C is that, in the sensor element substrate 10c, a barrier layer BA is located between a metal electrode C2 and a sensing layer R.

Figure 11:
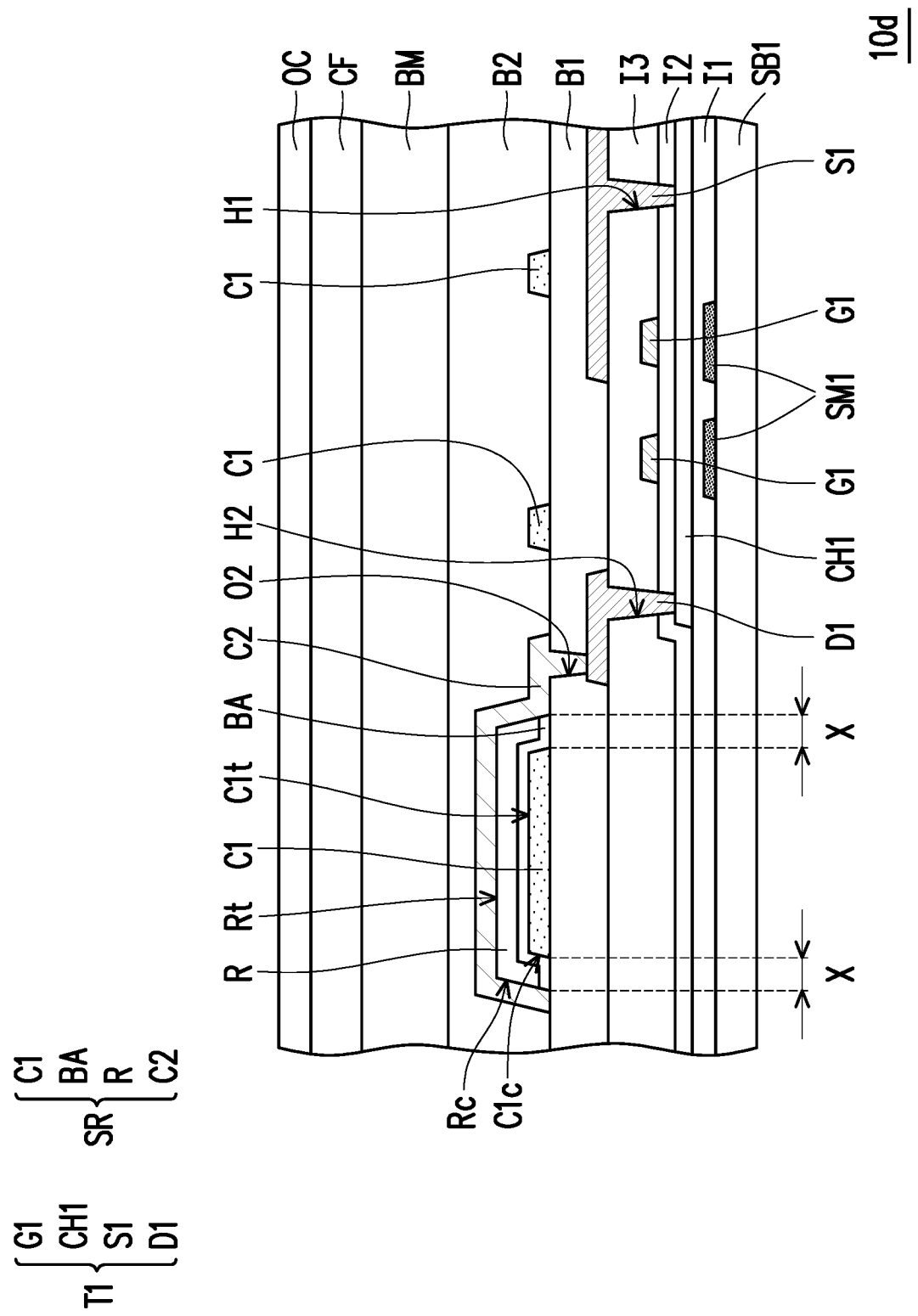
FIG. 11 is a cross-sectional schematic view of a sensor element substrate of the display device according to an embodiment of the disclosure.

FIG. 11 is a cross-sectional schematic view of a sensor element substrate of the display device according to an embodiment of the disclosure. It must be noted that the embodiment of FIG. 11 continues to use the element labels and part of the content of the embodiments of FIGS. 1 to 6. The same or similar labels are used to represent the same or similar elements, and description of the same technical content is omitted. Please refer to the foregoing embodiments for the description of the omitted part, which is not reiterated here.

The main difference between a sensor element substrate 10d in FIG. 11 and the sensor element substrate 10 in FIG. 3A is that the sensor element substrate 10d further includes a black matrix BM, a color filter pattern CF, and a cover layer OC.

With reference to FIG. 11, the black matrix BM is located on a passivation layer B2. The black matrix BM surrounds multiple opening regions (not shown). A pixel electrode E1 overlaps the opening regions. The black matrix BM overlaps a switch element T1, a first scan line SL1, a first data line DL1, and a signal line L of the sensor element substrate 10d.

The black matrix BM overlaps a photosensitive element SR in a direction perpendicular to a substrate SB2, thereby elevating the aperture ratio of the display device. In a preferred embodiment, the black matrix BM further overlaps a thin film transistor, a second scan line SL2, and a second data line DL2 of a pixel array substrate 20 in the direction perpendicular to the substrate SB2.

The color filter pattern CF is located on a passivation layer B2. The color filter pattern CF includes, for example, a red filter pattern, a green filter pattern, and a blue filter pattern. In some embodiments, the color filter pattern CF may further include filter patterns of other colors. The color filter pattern CF is disposed corresponding to an opening region. The cover layer OC is located on the color filter pattern CF.

Figure 12:
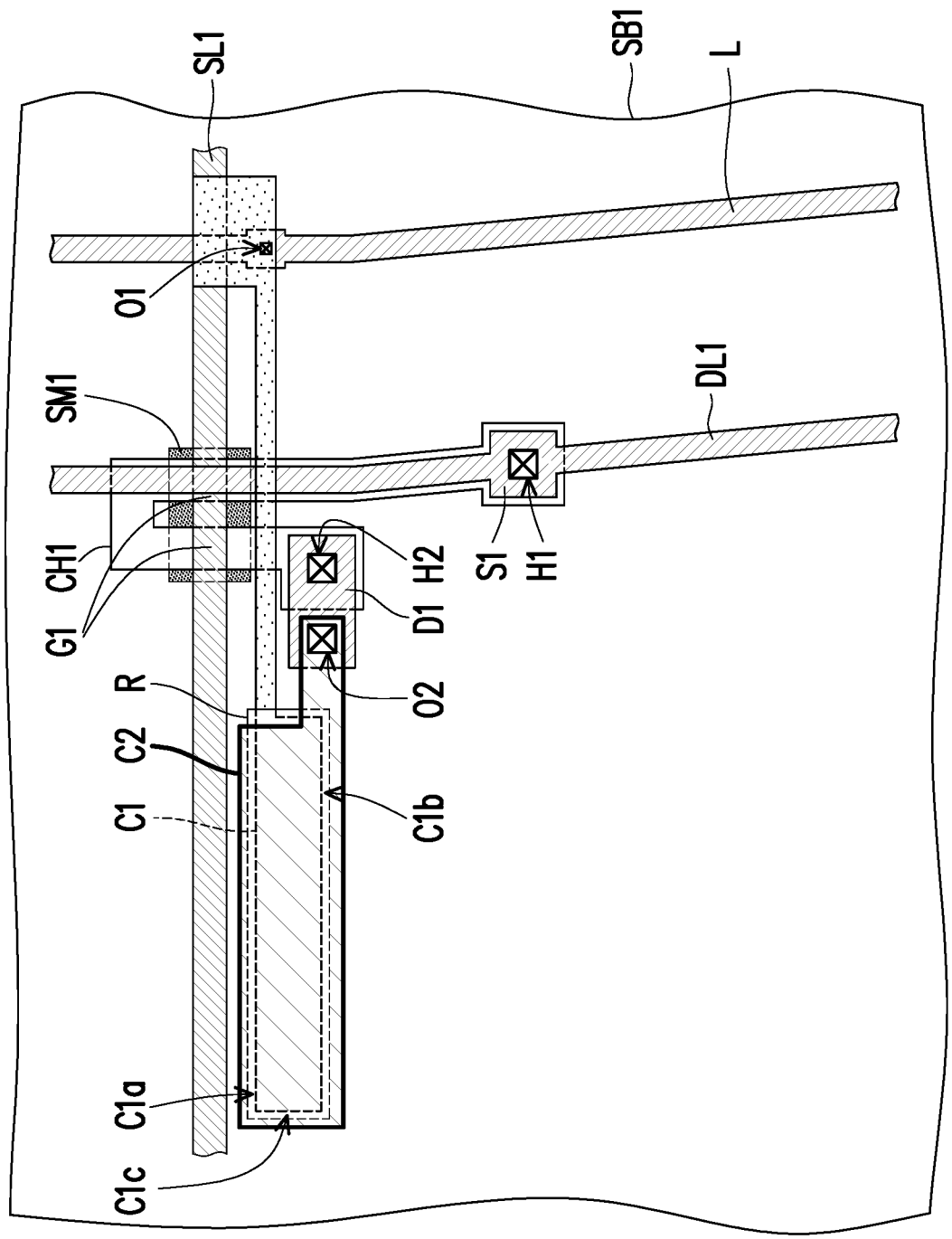
FIG. 12 is a bottom schematic view of a sensor element substrate of the display device according to an embodiment of the disclosure.

FIG. 12 is a bottom schematic view of a sensor element substrate of the display device according to an embodiment of the disclosure. It must be noted that the embodiment of FIG. 12 continues to use the element labels and part of the content of the embodiments of FIGS. 1 to 6. The same or similar labels are used to represent the same or similar elements, and description of the same technical content is omitted. Please refer to the foregoing embodiments for the description of the omitted part, which is not reiterated here.

The main difference between a sensor element substrate 10e in FIG. 12 and the sensor element substrate 10 in FIG. 2 is that the area of a photosensitive element SR of the sensor element substrate 10e is larger.

With reference to FIG. 12, in the embodiment, the photosensitive element SR may be disposed across multiple subpixels. For example, the photosensitive element SR overlaps more than two second data lines DL2 (located in a pixel array substrate 20), therefore the photosensitive element SR has a larger light-receiving area.

In summary, the barrier layer may suppress the photoelectric current, so as to flatten out the current-voltage curve (I-V curve) of the photosensitive element. Therefore, even if the photoelectric current is reduced due to current leakage of the photosensitive element, the fingerprint recognition by the photosensitive element will not be unclear due to an excessive change in the voltage difference.

What is claimed is:
1. A display device, comprising:
a pixel array substrate; and
a sensor element substrate, overlapping the pixel array substrate, and comprising:
  a substrate;
  a switch element, located on the substrate; and
  a photosensitive element, electrically connected to the switch element, and comprising:
    a transparent electrode;
    a sensing layer, located on the transparent electrode;
    a metal electrode, located on the sensing layer, and covering a first sidewall of the sensing layer; and
    a barrier layer, covering a first sidewall of the transparent electrode, wherein the barrier layer is located between the metal electrode and the sensing layer, or between the transparent electrode and the sensing layer, wherein the first sidewall of the sensing layer is located at a terminal of the sensing layer, and the first sidewall of the transparent electrode is located at a terminal of the transparent electrode.

2. The display device according to claim 1, wherein a thickness of the barrier layer is between 20 angstroms (Å) and 200 Å.

3. The display device according to claim 1, wherein the metal electrode covers a top surface of the sensing layer and a second sidewall of the sensing layer, wherein the second sidewall of the sensing layer is opposite to the first sidewall of the sensing layer.

4. The display device according to claim 1, wherein the barrier layer covers a top surface of the transparent electrode and a second sidewall of the transparent electrode, wherein the second sidewall of the transparent electrode is opposite to the first sidewall of the transparent electrode.

5. The display device according to claim 1, wherein a sidewall of the sensing layer is aligned with a sidewall of the barrier layer.

6. The display device according to claim 1, further comprising a plurality of opening regions, and a black matrix surrounding the plurality of opening regions, wherein a side of the sensing layer closest to the plurality of opening regions is not covered by the metal electrode.

7. The display device according to claim 6, wherein the black matrix overlaps the photosensitive element.

8. The display device according to claim 1, wherein a refractive index of the barrier layer is between 1.35 and 1.55.

9. The display device according to claim 1, wherein a material of the barrier layer comprises silicon oxide.

10. The display device according to claim 1, wherein the metal electrode is electrically connected to the switch element.

11. A display device, comprising:
   a pixel array substrate; and
   a sensor element substrate, overlapping the pixel array substrate, and comprising:
   a substrate;
   a switch element, located on the substrate; and
   a photosensitive element, electrically connected to the switch element, and comprising:
      a transparent electrode;
      a sensing layer, located on the transparent electrode;
      a metal electrode, located on the sensing layer, and covering a first sidewall of the sensing layer; and
      a barrier layer, covering a first sidewall of the transparent electrode, wherein the barrier layer is located between the metal electrode and the sensing layer, or between the transparent electrode and the sensing layer,
   wherein the barrier layer has a hole located on a top surface of the transparent electrode.

12. A display device, comprising:
   a pixel array substrate; and
   a sensor element substrate, overlapping the pixel array substrate, and comprising:
   a substrate;
   a switch element, located on the substrate; and
   a photosensitive element, electrically connected to the switch element, and comprising:
      a transparent electrode;
      a sensing layer, located on the transparent electrode;
      a metal electrode, located on the sensing layer, and covering a first sidewall of the sensing layer; and
      a barrier layer, covering a first sidewall of the transparent electrode, wherein the barrier layer is located between the metal electrode and the sensing layer, or between the transparent electrode and the sensing layer,
   wherein the barrier layer extends continuously within an entire overlapping region between the transparent electrode and the metal electrode.

* * * * *